United States Patent
Yu et al.

(10) Patent No.: US 7,638,098 B2
(45) Date of Patent: Dec. 29, 2009

(54) PROCESS AND DEVICE FOR COUPLING HOLLOW FIBERS TO A MICROFLUIDIC NETWORK

(75) Inventors: Ying Yu, Dortmund (DE); Ralf-Peter Peters, Bergisch-Gladbach (DE); Wolfgang Stoeters, Muelheim (DE)

(73) Assignee: Boehringer Ingelheim microParts GmbH, Dortmund (DE)

( * ) Notice: Subject to any disclaimer, the term of this patent is extended or adjusted under 35 U.S.C. 154(b) by 761 days.

(21) Appl. No.: 10/953,064

(22) Filed: Sep. 30, 2004

(65) Prior Publication Data

US 2005/0106752 A1 May 19, 2005

(30) Foreign Application Priority Data

Sep. 30, 2003 (DE) ................. 103 45 817

(51) Int. Cl.
*B01L 3/02* (2006.01)
(52) U.S. Cl. .................. 422/100; 422/99; 436/174; 436/180; 210/646
(58) Field of Classification Search ........... 422/99–100; 436/180, 174; 210/646
See application file for complete search history.

(56) References Cited

U.S. PATENT DOCUMENTS 4,657,341 A  4/1987  Sammueller
5,942,112 A * 8/1999  Ishak ................. 210/321.6
5,985,086 A  11/1999  Peall
6,290,791 B1  9/2001  Shaw et al.

FOREIGN PATENT DOCUMENTS

| FR | 2 813 073 | | 2/2002 |
| WO | WO 98/25065 | * | 6/1998 |
| WO | WO 01/86154 | | 11/2001 |
| WO | WO 01/86154 A1 | | 11/2001 |

OTHER PUBLICATIONS

W. Menz, J. Mohr (Mikrosystemtechnik für Ingenieure) 2., erweiterte Auflage, VCH, A Wiley company, pp. 355-357.
European Search Report.

* cited by examiner

*Primary Examiner*—Brian R Gordon
*Assistant Examiner*—Jyoti Nagpaul
(74) *Attorney, Agent, or Firm*—David S. Safran; Roberts Mlotkowski Safran & Cole, P.C.

(57) ABSTRACT

A microfluidic network having at least one channel which is open on the top side and in which one end of at least one hollow fiber is inserted and a process for making it. For this it is provided that the outside dimensions of the hollow fiber are matched to the inside dimensions of the channel, capillary channels being formed between the hollow fiber and the walls of the channel. The network is covered with a cover film or plate which closes the channel and preferably fixes the hollow fiber temporarily in the channel, and the capillary channels are filled with a fluidically sealing cement. In the area of the inserted end of the hollow fiber, a capillary stop structure is formed so that the cement as it is added it cannot seal the inserted open end of the hollow fiber.

18 Claims, 2 Drawing Sheets

PROCESS AND DEVICE FOR COUPLING HOLLOW FIBERS TO A MICROFLUIDIC NETWORK

BACKGROUND OF THE INVENTION

1. Field of the Invention

The invention relates first of all to a process for coupling at least one hollow fiber to a microfluidic network, the microfluidic network having at least one channel which is open on the top side and in which the hollow fiber is inserted with one end. Furthermore the invention relates to a device for implementing this process, specifically a microfluidic system consisting of a microfluidic network with a microstructure carrier and a coupled microfluidic hollow fiber which is inserted with one end in the channel and which discharges on the face side into the channel.

2. Description of Related Art

In Microsystems engineering, connecting components with microstructured surfaces to one another by cementing is known. With these processes, often only two planar parallel surfaces are cemented to one another. In doing so, cement flows in one plane. In order to cement to one another the components to be joined with sufficient positioning accuracy, they must be temporarily fixed relative to one another by another technique before the actual cementing process. This is difficult when several parts are to be fluidically tightly cemented to one another on different planes, especially when one of the components which is to be cemented to another is comparatively movable, especially for a hollow fiber.

Allowing a cement which is liquid in the processing state to flow into narrowly dimensioned channels, grooves or other function areas by using capillary forces is incidentally known in and of itself (see especially, Wolfgang Menz, Juergen Mohr: Microsystems Engineering for Engineers, VCH Verlagsgesellschaft mbH, 2nd edition, 1997, ISBN 3-527-29405-8).

German Patent DE 34 08 783 C2 and its counterpart U.S. Pat. No. 4,657,341 relate to a connecting element for optical fibers, the fibers being cemented into microstructured grooves.

International Patent Application Publication WO 98/25065 A1 and its counterpart U.S. Pat. No. 6,290,791, which form the starting point of this invention, disclose a microfluidic network having at least one hollow fiber which is cemented into a channel. The hollow fiber is inserted into the channel, the channel is covered by a cover plate, and then a cement is supplied, if necessary, via a lateral feed, which cement, if necessary, can be cured by UV radiation especially in the area of the end face of the hollow fiber and the hollow fiber is cemented in the channel. However, the known process does not ensure optimum positioning of the hollow fiber in the channel. The problem is especially that excess cement can undesirably penetrate into the inserted open end of the hollow fiber and can seal it.

International Patent Application Publication WO 97/29394 A1 and its counterpart U.S. Pat. No. 5,985,086 relate to cementing an optical fiber into a V-groove, the cement being supplied via two opposing lateral feed channels to the V-groove so that complete jacketing of the fiber with cement can be avoided.

International Patent Application Publication WO 01/86154 A1 discloses cementing of a capillary tube into a channel, the inside surface of the channel and the outside surface of the capillary tube being kept in a predetermined orientation and at a predetermined distance relative to one another in order to achieve the desired capillary effect between them and cement being supplied in a matched amount to fill the intermediate space. However, it is difficult and can be complex to determine and maintain this amount. The problem is especially that excess cement can undesirably penetrate into the inserted open end of the hollow fiber and can seal it.

French Patent Publication FR 2 813 073 A1 discloses the cementing of capillary tubes in V-shaped grooves of a microstructure, several capillary tubes being introduced by means of a holding element into grooves which project relative to the cover and being pushed to under the cover and then being cemented in the grooves by means of cement. It is a particular problem that excess cement can undesirably penetrate into the inserted open end of the hollow fiber and can seal it.

SUMMARY OF THE INVENTION

A primary object of this invention is to devise a process for coupling at least one microfluidic hollow fiber to a microfluidic network and a microfluidic system provided with it, unwanted sealing of the hollow fiber by cement being able to be easily and reliably prevented on its inserted open end and especially the desired positioning and fixing of the hollow fiber and/or optimum simultaneous cementing and sealing of several parts being enabled.

This object is achieved by a process and a microfluidic network in accordance with the invention, wherein a capillary stop structure, which is formed in the area of the end of the hollow fiber in the channel, results in that the cement remains stationary when being added in front of or at the end of the hollow fiber and accordingly it cannot seal the hollow fiber. The capillary stop structure can be produced very easily and economically and allows very simple addition of the cement since, in particular, no additional precautions need be taken to prevent sealing of the hollow fiber by the cement. Rather, in the preferred embodiment, the capillary stop structure is enough to stop the cement flow towards the face end of the hollow fiber. The approach of the invention accordingly allows very simple production of the microfluidic systems in accordance with the invention, since, for example, an especially matched amount of cement need not be supplied and since, for example, it is not necessary either to actively stop the cement by local curing or the like before the end of the hollow fiber.

Preferable, at least temporary fixing of the hollow fiber which has been inserted in the channel by the cover film or plate, especially until addition and curing of the cement, very easily enables very accurate positioning and fixing of the hollow fiber. This is conducive to defined connection and sealing. Furthermore, simple and rapid production is allowed since especially additional holding means or the like for positioning of the hollow fiber in the channel during cementing are not necessary.

In particular, the advantage is achieved that a simple channel structure which is designed for cementing and which is located on a microfluidic microstructure carrier, performs two functions at the same time. On the one hand, an inherently movable hollow fiber is fixed before cementing by the structure so that the hollow fiber lies exactly in its intended position and essentially can no longer move. On the other hand, the cement which is liquid in the processing state is optimally guided into the area which is to be cemented by the channel structure of the microstructure carrier. Microfluidic modules can thus be cemented to movable components fluidically tightly and without clogging. This must take place not only in one plane, but can also extend over several coupling points in several planes in the sense of a three-dimensional microfluidic network.

The invention results in that the microfluidic hollow fibers can be joined by cementing to a microfluidic network with microstructured channels on a chip which is covered by a cover film or a cover plate without the need for additional sealing components. A cover plate in this sense can also be another microstructured chip.

According to another teaching of the invention, capillary stop structures and/or drain channels ensure exact metering of the cement in the processing state so that the hollow fiber or hollow fibers in the channel or channels are cemented liquid-tight, but the channel within the hollow fiber remaining free of any cement entry.

This system is especially preferred due to the fact that the process can be used in production since the inevitable fluctuations in the metering system of the cement are compensated by the channel structure in the microstructure carrier by itself.

In a process engineering respect, first of all, the cement which is liquid in the processing state fills the capillary channels which remain between the hollow fiber and channel walls using the capillary forces which occur there. Afterwards, the cement is brought into the final state, especially cured. Curing can take placed by increasing the temperature. It depends on the material of the cement how the final state is achieved.

For optimum operation of the process as of invention, it is especially feasible if the capillarity of the capillary channels is greater than the capillarity of the feed channel and/or the drain channel. In this way, it is ensured that the liquid cement enters in the desired manner between the hollow fibers and the channel walls. With respect to the quantitative dimensioning of the capillarities, what is important is the channel cross section, the viscosity of the cement, the wettability of the cements on the specific surface, etc. This is determined in particular by one skilled in the art for the respective application.

Moreover, it must be stated that the channels in which the hollow fibers are enclosed are open on the other end to the ambient atmosphere in order to enable the cement to run into the capillary channels. This is preferred in any case if the intention is not to use controlled pressure elevations or controlled underpressure.

It is interesting that, with the system according to the invention, by means of a drain channel, excess cement can be drained out of the channel in the processing state.

In addition to the capillary stop structure, a mask with a slot can be provided at the correct point at which the cement is to remain in the capillary channel. For example, here, UV radiation passes through a cover film which is otherwise not permeable to UV radiation. The cement which reaches the passage point cures here and accordingly cannot flow further.

Alternatively or additionally, the flow of the cement in the capillary channels is observed, and optionally, the curing of the cement is initiated in a deliberate manner.

For the hollow fiber, polymer materials can be used; however, metal capillary tubes, glass capillary tubes or capillary tubes of ceramic or cellulose are also known which can perform the function of such a hollow fiber. Hollow fibers of this type are also especially dialysis fibers as are used in dialysis machines.

Special viscosity ranges for the liquid cement which forms the cement in the processing state are the subject matter of dependent claims. In particular it is cement which cures under UV radiation.

A cement which is sensitive to UV radiation requires a corresponding cover film or cover plate.

In a process engineering regard according to one preferred teaching of the invention the cement is delivered into the channel without pressure, i.e. only under the action of the inherent pressure of the cement supply. In particular the capillary forces in the capillary channels are therefore responsible for "drawing in" the cement. This ensures that the capillary stop structures in the microstructure carrier reliably develop their action so that the lengthwise channel which is formed in the interior of the hollow fiber is not blocked.

The process engineering measure by which the cement is introduced into the network with an essentially vertical alignment of the network from overhead is of special importance, and fixing of the cement, especially curing of the cement, preferably takes place with an essentially horizontal alignment of the network.

Basically, it is possible to place a hollow fiber in a channel. However, it is also feasible to place more than one hollow fiber, especially two hollow fibers, which are cemented at the same time with the cement, in one channel. Basically, it is also possible to connect two hollow fibers which have been pushed inside one another with such a capillary cementing technique.

Normally, in a microstructure carrier of a microfluidic network, there will be a number of channels which hold a number of hollow fibers on the end side. For this, an especially preferred process engineering approach is place hollow fibers in several channels of the network which connected to one another by at least one connecting channel for the cement, and which performs the function of a drain channel for one channel and the function of a feed channel for another channel which allows coupling of the channels. This can be provided in groups; this will be the preferred approach.

With respect to the already addressed microfluidic system, a detailed explanation of preferred embodiments of the invention is set forth below with reference to the accompanying drawings.

DETAILED DESCRIPTION OF THE INVENTION

Figure 1:
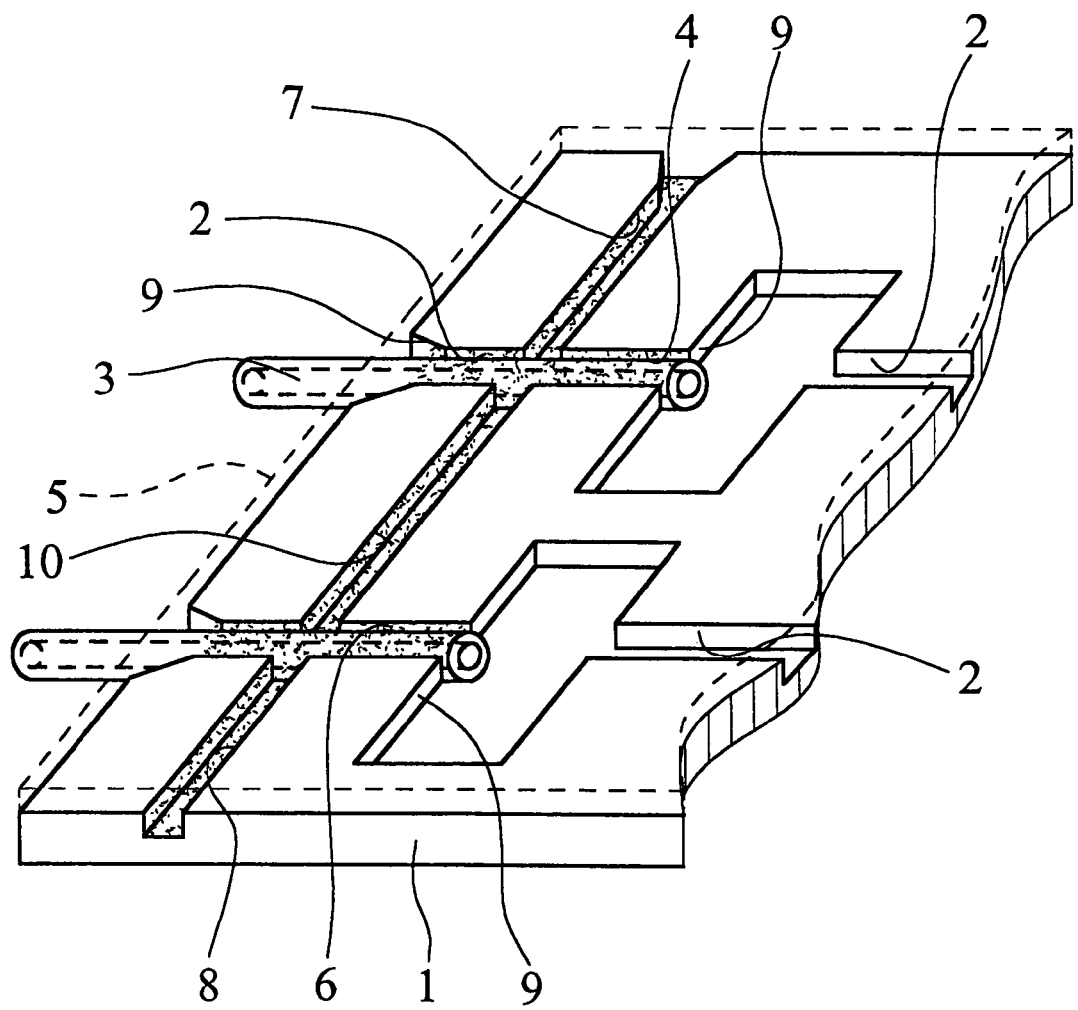
FIG. 1 is a perspective view of a microfluidic system in accordance with the invention.

The microfluidic system which is shown in FIG. 1 is composed of a microfluidic network with a microstructure carrier 1 with at least one channel 2 and a microfluidic hollow fiber 3, one end of which is inserted into the channel 2 and which discharges at its end face into the channel 2. The outside dimensions, especially the outside diameter, of the hollow fiber 3 are matched to the inside dimensions, especially the width and the depth, of the channel 2, such that capillary channels 4 are formed between the hollow fiber 3 and the walls of the channel 2, especially in the gussets which remain in the angles. Additionally, the network is covered with a cover film or plate 5 which is fixed on the microstructure carrier 1 and which closes the channel 2. The capillary channels 4 are filled by a fluidically sealing cement 6. The cover film 5 is represented in FIG. 1 only by a broken line and not to scale, and is a hot sealing film of a polymer plastic, here, which is permeable to UV radiation. However, it can also be a plate-like cover, for example, of glass. It can also be itself, in turn, a chip.

It is especially preferred that the cement 6 is introduced laterally into the channel 2. To do this, in the illustrated embodiment, there is at least one feed channel 7 which discharges laterally into the channel 2 where the hollow fiber 3 is inserted, with its other end forming an inlet point for a cement 6 which is liquid in the processing state. The feed channel 7 is located, here, laterally from the channel 2. In principle, it could also discharge into the channel 2 orthogonally from underneath through the microstructure carrier 1, therefore, for example, a silicon chip. Here, it is a matter of feeding of the cement 6 into the feed channel 7 which must be accomplished in some way, for example, through an opening in the cover film 5. It should be mentioned here that several connections can also lie in several planes in the sense of a three-dimensional microfluidic network as mentioned above.

Figure 2:
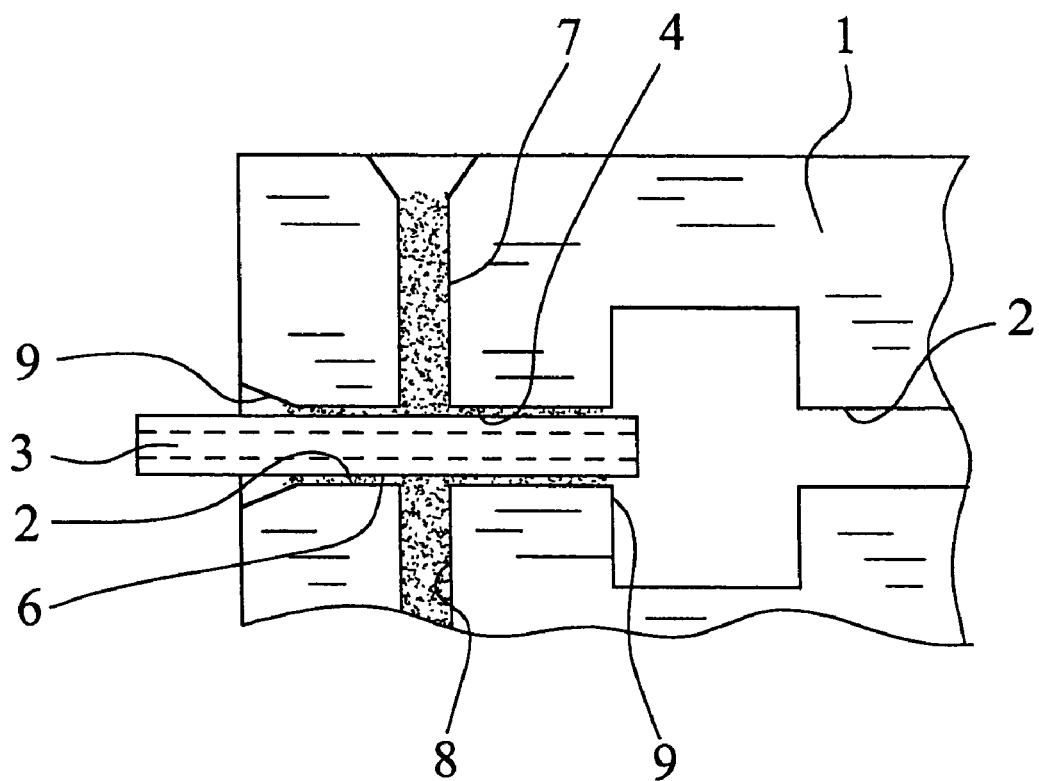
FIG. 2 is a top view of a portion of the microfluidic system from FIG. 1.

FIGS. 1 & 2 show further that there is at least one drain channel 8 which proceeds laterally from the channel 2 where the hollow fiber 3 is inserted and through which the excess cement 6 can drain. Therefore, under the natural pressure of the cement, it can be metered with excess and it is ensured that the drain channel 8 removes excess cement 6 so that the cement 6 does not reach and block the inner channel in the hollow fiber 3.

So that there is no blocking of inside channel of the hollow fiber 3, in the preferred embodiment shown, it is provided that roughly where the hollow fiber emerges from the channel 2 to the outside and/or where the end of the hollow fiber 3 is located in the channel 2, in the channel 2, in any case, the wall sections are made with a capillary stop structure 9 which runs obliquely, which is step-like and which widens the channel 2. It is shown in FIG. 2 that the capillary stop structure 9 forms a trapezoidal widening on the outer end of the channel 2. Furthermore, it is shown in FIG. 2 that, in the embodiment shown here, the capillary stop structure 9 forms a bilateral step on the inner end.

In the two above explained cases, therefore, on the two ends of the channel 2, it can be assumed that there is a modification by the capillary stop structures 9 also on the bottom, therefore in the microstructure carrier 1. This structure should not be on the top because there the microstructure carrier 1 of the microfluidic network is covered smoothly by means of the cover film 5 which does not allow these structures.

In principle, the end of the hollow fiber 3 itself also forms a shoulder which constitutes the capillary stop structure 9. But occasionally, this is not as reliably effective as an additional capillary stop structure 9. Nevertheless, this simple shoulder is also suited when, for reasons of the three-dimensional arrangement, the larger dimensions of the capillary stop structures 9 cannot be used as shown in the drawings.

The trough-like capillary stop structures 9 in the drawings can be made smaller, therefore, can have a smaller capacity when the angle on the end of the hollow fiber 3 is selected to be beyond 90°, and thus, implements "ear-like" capillary stop structures 9 in a retrograde manner. Then, it is still more reliably ensured that there is no blocking of the inner channel of the hollow fiber 3 by cement.

In the extreme case, just in front of the end of the hollow fiber 3, on the side capillary channels 4, they can have their own channel-like capillary structures which act, to a certain extent, as "suction channels" before the end of the hollow fiber 3 and drain excess cement 6 into the corresponding collecting spaces.

An alternative capillary stop structure 9 forms a widening or passage point in a film or plate made as a mask on the microfluidic network at the point at which the cement 6 is intended to remain in the capillary channels 4 around the hollow fiber 3.

In addition, observation of introduction of the cement 6 which has been explained in the general part of the description can take place in order to stop the cement 6 as necessary and/or transfer it into the end state.

To have some idea of the dimensions involved here, the channel 2 can be made with a width and a depth from roughly 30 microns to roughly 500 microns, preferably from roughly 100 microns to roughly 300 microns, and the hollow fiber 3 is made with dimensions which are matched thereto, especially a diameter which is matched thereto, from roughly 30 microns to roughly 500 microns, preferably from roughly 100 microns to roughly 300 microns. The inside diameter of the inner channel in the hollow fiber 3 should be between 5 microns and 450 microns, preferably between roughly 50 microns and roughly 250 microns.

The fluid which is transported within the hollow fiber 3 is, first of all, a liquid, for example, a liquid which is relevant in dialysis. However, basically, a gas is also possible. A dialysis fiber as a hollow fiber 3, moreover, has a semi-permeable jacket which allows exchange of media in a dialysis machine or in a measurement engineering structure.

Preferred versions of the material for the hollow fiber are a polymer material, a metal, for example, high grade steel, glass or also ceramic or cellulose.

It was already mentioned above that the cement 6 can be especially a cement which cures under UV radiation and which starts and ends its curing process under strict control. If such a cement 6 is used, the cover film 5 or the cover plate should be made from a material which is permeable to UV radiation. For the cement 6, for example, acrylates, urethanes, and also binary epoxy resins are possible. The cover film 5 can also be, for example, of polycarbonate, polyester, polystyrene or PVC or can be produced on this basis.

It was already explained above that the cement 6, in the processing state, should have a viscosity from roughly 100 mPas to roughly 400 mPas.

Not shown in the drawing, is a version to which it applies that the channel 2 is made with a width which corresponds to roughly twice the depth and which makes it possible to cement two hollow fibers 3 at the same time in one channel 2. The corresponding can also apply to a three-channel version or the like.

FIG. 1 shows, in this respect, a preferred embodiment of the invention where several channels 2 of the network, into which hollow fibers 3 are placed, are connected to one another by at least one connecting channel 10 for the cement 6 which performs the function of the drain channel for the channel 2 and the function of a feed channel for the other channel 2. It can be easily imagined using FIG. 2 how this microfluidic system is filled for introducing the cement 6 into the network with an essentially vertical alignment proceeding, from overhead, specifically from the inlet of the feed channel 7. This yields by itself the discharge of the liquid cement 6 from the drain channel 8 on the bottom end of the microfluidic network. By capillary forces, a side distribution into the channels 2 with the hollow fibers 3 takes place until the capillary stop structures 9 stop.

For curing purposes the entire arrangement is moved into a horizontal alignment and then irradiated with UV radiation.

What is claimed is:

1. Microfluidic system, comprising a microfluidic network with a microstructure carrier with at least one channel and at least one microfluidic hollow fiber, one end of which is disposed in the at least one channel so as to be able to discharge into the channel, outside dimensions of the at least one hollow fiber being matched to the inside dimensions of the at least one channel in a manner forming capillary channels between the at least one hollow fiber and walls of the at least one channel, the network being covered with a cover film or plate which is fixed on the microstructure carrier and which closes the at least one channel, wherein the capillary channels are filled with a fluidically sealing cement up to a capillary stop structure in the area of the end of the hollow fiber in the channel, penetration of the cement in the liquid state into the end of hollow fiber having been prevented by the capillary stop structure; wherein the capillary stop structure is formed by a channel section forming a trapezoidal widening on the outer end of said at least one channel that is wider than said at least one channel and into which the end of the hollow fiber extends.

2. Microfluidic system as claimed in claim 1, wherein the cover film or plate fixes the hollow fiber in the channel is removable from the network after the cement is cured.

3. Microfluidic system as claimed in claim 1, wherein the capillary stop structure forms a bilateral step on an inner end.

4. Microfluidic system as claimed in claim 1, wherein the outer capillary stop structure widens obliquely.

5. Microfluidic system as claimed in claim 1, wherein at least one feed channel is provided which has a first end which discharges laterally into the at least one channel of the network where the at least one hollow fiber is disposed, a second end which formed an inlet point for the cement.

6. Microfluidic system as claimed in claim 1, wherein at least one drain channel proceeds laterally from the at least one channel in which the at least one hollow fiber is disposed and through which excess cement can drain.

7. Microfluidic system as claimed in claim 1, wherein the channel has a width and a depth of about 30 to 500 microns, and wherein the hollow fiber has dimensions which matched to those of the channel.

8. Microfluidic system as claimed in claim 7, wherein the channel has a width and a depth of about 100 microns to roughly 300 microns, and wherein the hollow fiber has dimensions which matched to those of the channel.

9. Microfluidic system as claimed in claim 1, wherein the hollow fiber is a fiber of made of a material selected from the group consisting of a polymer material, metal, glass, ceramic and cellulose.

10. Microfluidic system as claimed in claim 1, wherein the hollow fiber is a dialysis fiber.

11. Microfluidic system as claimed in claim 1, wherein the cement is an adhesive substance which in the processing state had a viscosity of about 10 to 600 mPas.

12. Microfluidic system as claimed in claim 11, wherein the cement is an adhesive substance which in the processing state had a viscosity of about 100 to 400 mPas.

13. Microfluidic system as claimed in claim 1, wherein the cement is a cement cured under UV radiation.

14. Microfluidic system as claimed in claim 1, wherein the cover film or plate is a material which is permeable to ultraviolet radiation.

15. Microfluidic system as claimed in claim 1, wherein the cover film or plate is a hot sealing film.

16. Microfluidic system as claimed in claim 1, wherein the at least one channel has a width which corresponds to roughly twice the depth thereof, and wherein two hollow fibers are cemented in the same channel.

17. Microfluidic system as claimed in claim 1, wherein the network into which the hollow fibers has a plurality of channels in which at least one fiber is received, said channels being connected to one another by at least one connecting channel for the cement, which enabled cement to be drained from a first channel and for cement to have been fed to another channel.

18. Microfluidic system as claimed in claim 1, wherein the at least one connecting channel is disposed at a right angle relative to the channels of the network in which at least one fiber is disposed.

* * * * *